United States Patent
Voss et al.

(10) Patent No.: US 6,426,143 B1
(45) Date of Patent: Jul. 30, 2002

(54) MOULDED PART AND FLEXIBLE FILM WITH A PROTECTED PRINTED CONDUCTOR, AND METHOD FOR PRODUCING THE SAME

(75) Inventors: Jochen Voss, Leverkusen; Gerhard Dieter Wolf, Dormagen; Friedrich Jonas, Aachen, all of (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/646,558
(22) PCT Filed: Mar. 11, 1999
(86) PCT No.: PCT/EP99/01560
§ 371 (c)(1),
(2), (4) Date: Sep. 19, 2000
(87) PCT Pub. No.: WO99/49707
PCT Pub. Date: Sep. 30, 1999

(30) Foreign Application Priority Data

Mar. 24, 1998 (DE) .......................... 198 12 880

(51) Int. Cl.⁷ .............................. H05K 3/18; H05K 3/20; H05K 3/28; H01B 7/08
(52) U.S. Cl. .................. 428/378; 428/375; 174/72 TR; 174/254
(58) Field of Search ................... 428/375, 378; 174/254, 259, 72 TR

(56) References Cited

U.S. PATENT DOCUMENTS 3,168,617 A * 2/1965 Richter (List continued on next page.)

FOREIGN PATENT DOCUMENTS

| | | |
|---|---|---|
| EP | 122619 | 10/1984 |
| EP | 225012 | 5/1989 |
| EP | 485838 | 5/1992 |
| EP | 817557 | 1/1998 |
| WO | 87/01557 | 3/1987 |
| WO | 88/02592 | 4/1988 |

OTHER PUBLICATIONS

Research Disclosure, Bd. 273, Nr. 02, Jan. 1987, Seite 1 XP002105907, Havant GB, Siehe das ganze Dokument "Metalized plastic enclosure forf EMC shielding".

Japan Plastics Age., Bd 10, Nr. 8, Aug. 1972, Seiten 52–63, XP002065045, Tokyo JP, Siehe Seite 53057, linke Spalte, T. Wantanabe et al, "Copper clad laminated boards for fexible printed circuits".

(List continued on next page.)

Primary Examiner—Cathy Lam
(74) Attorney, Agent, or Firm—Joseph C. Gil; Diderico van Eyl

(57) ABSTRACT

A shaped plastic part and a flexible film with a protected conductor track, in particular made from copper, are described, as is a process for their production. The shaped plastic part or the flexible film is composed at least of a plastic film (1) as backing layer, and of a metalizable primer layer (2) applied thereto, and of a structured, metallic electrically conducting layer (3), in particular electrical conductor tracks, applied to the primer layer (2), where an additional outer film (4) or a plastic article (6) has been firmly connected to the composite made from backing layer (1), primer layer (2) and from conducting layer (3) in such a way that the outer film (4) or the plastic article (6) covers at least part of the conducting layer (3).

29 Claims, 4 Drawing Sheets

U.S. PATENT DOCUMENTS

Figure 1:
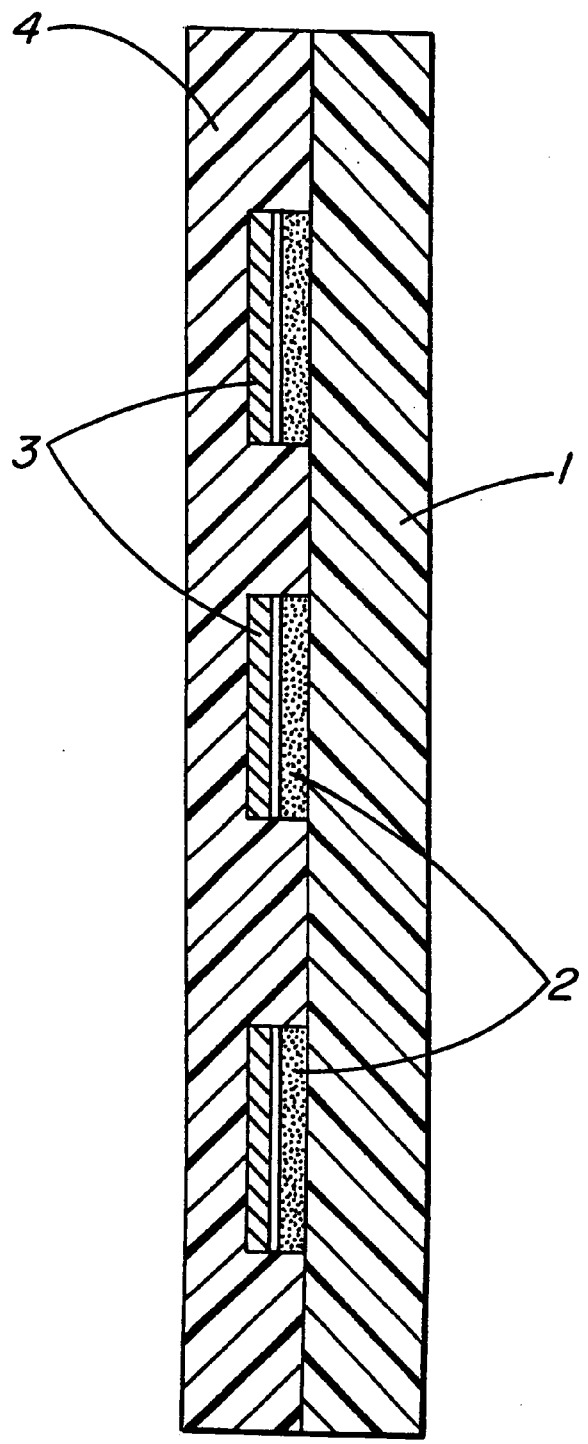

| | | | |
|---|---|---|---|
| 3,215,574 A | * 11/1965 | Korb | |
| 3,536,545 A | * 10/1970 | Traynor et al. | |
| 3,905,929 A | 9/1975 | Noll | 260/29.2 TN |
| 3,920,598 A | 11/1975 | Reiff et al. | 260/29.2 TN |
| 4,075,420 A | * 2/1978 | Walton | 174/117 F |
| 4,237,264 A | 12/1980 | Noll et al. | 528/67 |
| 4,514,586 A | 4/1985 | Waggoner | 174/35 MS |
| 4,663,240 A | 5/1987 | Hajdu et al. | 428/545 |
| 4,710,419 A | 12/1987 | Gregory | 428/210 |
| 4,910,045 A | 3/1990 | Giesecke et al. | 427/98 |
| 5,075,039 A | 12/1991 | Goldberg | 252/518 |
| 5,076,841 A | 12/1991 | Chen et al. | 106/1.25 |
| 5,120,578 A | 6/1992 | Chen et al. | 427/304 |
| 5,182,135 A | 1/1993 | Giesecke et al. | 427/98 |
| 5,233,753 A | * 8/1993 | Wolf et al. | 29/831 |
| 5,296,020 A | 3/1994 | Reichert et al. | 106/1.11 |
| 5,300,140 A | 4/1994 | Wolf et al. | 106/1.11 |
| 5,378,268 A | 1/1995 | Wolf et al. | 106/1.11 |
| 5,436,034 A | 7/1995 | Giesecke et al. | 427/508 |

OTHER PUBLICATIONS

Galvanotechnik, Bd. 84, Nr. 2, 1993, Seiten 570–575, XP002105906, Saulgau/Wurtt De, siehe das ganze Dokument, H. Giesecke et al, "Herstellung flexibler Schaltungen mit Bayprint—eine zukunftsweisende Technologie" No month.

Angew. Chemie, Nr. 2, (month unavailable) 1970, pp. 53–63, Von D. Dieterich et al, "Polyurethan–Ionomere, eine neue Klasse von Sequenzpolymeren" No month.

Habenicht, Kleben, [Adhesive Bonding], pp. 335–351, Berlin: Springer (month unavailable) 1986 "13.3 Kleben der Kunststoffe, 13.3.1 Grundlagen".

* cited by examiner

MOULDED PART AND FLEXIBLE FILM WITH A PROTECTED PRINTED CONDUCTOR, AND METHOD FOR PRODUCING THE SAME

FIELD OF THE INVENTION

The invention relates to a shaped part and to a flexible film with a protected conductor track, in particular, made from copper, and also to a process for their production. The shaped plastic part or the flexible film is composed at least of a plastic film as backing layer, of a metalizable primer layer applied thereto, and of a structured, metallic electrically conducting layer, in particular electrical conductor tracks, applied to the primer layer, where an additional outer film or a plastic article has been firmly connected to the composite made from backing layer, primer layer and conducting layer in such a way that the backing film or the plastic article covers at least part of the conducting layer.

BACKGROUND OF THE INVENTION

Many different types of platinae and of printed circuits have become known in the electrical engineering sector. In particular, various proposals have been made for the production of flexible circuits, i.e. electrical circuits applied to flexible plastics as backing.

Flexible circuits can be produced as given in the Patent Application WO 87/01557, by using screen printing technology to print a backing film with a conducting paste, for example based on silver powder, copper powder or nickel powder and/or graphite in the form of the circuit layout desired. These circuits have the disadvantage that the conductive pastes used have modest electrical properties and cannot be soldered.

U.S. Pat. No. 4,710,419 has disclosed an injection-moulded circuit which is produced from a copper-laminated foil by printing with a developable resist, back-moulding the film with a thermoplastic and using chemical etching to remove the copper layer not covered by resist layer. The disadvantage of this circuit is that the copper layer can break when exposed to stress and the adhesive layer has electrical and thermal properties which are disadvantageous for the copper film. The etching process is comparatively complicated and, besides this, the resist layer has to be removed in an additional operation at soldering points to allow adhesion of the solder.

European Patent EP 485 838 A2 has disclosed injection-moulded printed circuit boards which are produced by back-moulding of flexible electronic circuits with thermoplastics, where the conductor tracks are produced on the flexible backings used by direct additive or semiadditive metalization. The flexible backings used here have firmly adhering conductor tracks produced on their surfaces by printing the flexible backing with a screen-printing paste comprising a metalizing activator in the shape of the conductor track layout, drying the applied print of the conductor track layout and finally producing a copper layer in the shape of the printed conductor track layout with a height of from 0.05 to 10 $\mu$m in a chemical, currentless copper bath. To produce the rigid circuit the film is back-moulded with plastic.

The conductor tracks produced in this way have the disadvantage that the copper conductor tracks are open and unprotected and typically have to be oxidation-protected by a very fine layer of nickel.

An object of the invention was to develop a flexible film which carries electrical conductor tracks which have been provided in a simple manner with mechanical protection or oxidation-protection. In particular, it should be possible to provide even a three-dimensionally shaped film or a corresponding moulding which has a protected electrical conductor track and in which the function and structure of the conductor track are retained in the three-dimensional form.

Another object of the invention was to develop a moulding or a film-which comprises, in integrated form, mechanically protected screening with respect to electromagnetic radiation, preferably in the range from 1 MHz to 500 GHz.

DESCRIPTION OF THE INVENTION

The object is achieved by means of a flexible film with a protected conductor track, which is the subject matter of the invention, composed at least of a plastic film as backing layer, of a metalizable primer layer applied thereto, and of a structured, metallic electrically conducting layer, in particular electrical conductor tracks, applied to the primer layer, characterized in that an additional outer film has been firmly connected to the composite made from backing layer, primer layer and conducting layer in such a way that the outer film covers at least part, in particular at least 95%, of the conducting layer.

The outer film is preferably composed of a thermoplastic.

The thermoplastic outer film has preferably been directly welded or adhesive-bonded to the plastic backing film at free locations between the tracks of the conducting layer.

In one version, the outer film is composed of a thermosetting plastic, in particular of a polymer selected from the group consisting of UF (urea/formaldehyde resins), PF (phenol/formaldehyde resins), EP (epoxy resins), PI (polyimides) and polyacrylate, preferably polydimethyl methyl metacrylate (PMMA).

The thermosetting outer film has preferably been directly adhesive-bonded to the plastic film at free locations between the tracks of the conducting layer.

A particularly advantage of the novel film is that it can be shaped three-dimensionally. A process of shaping the film printed with the primer, for example deep drawing or blow moulding, before application on the metal layer, enables embossed-in structures to be obtained, even with a three-dimensionally shaped film (e.g. a hollow shape or shell), which has, after metalizing, functional conductor tracks of a particular structure.

The electrically conducting layer of the film has, in particular, a thickness of from 0.1 to 40 $\mu$m, preferably from 0.5 to 20 $\mu$m, particularly preferably from 1 to 5 $\mu$m.

The electrically conducting layer is preferably composed of a metal suitable for currentless metalization, in particular of Cu, Ni, Ag, Au or Pd, preferably Cu and Ni, particularly preferably Cu, alone or in any desired combination.

The invention also provides a shaped plastic part with an embedded protected conductor track, composed at least of a plastic film as backing layer, of a metalizable primer layer applied thereto, and of a structured, metallic electrically conducting layer, in particular electrical conductor tracks, applied to the primer layer, and of a plastic article, characterized in that the plastic article has been firmly connected to the composite made from backing layer, primer layer and conducting layer in such a way that the plastic article covers at least part, in particular at least 95%, of the conducting layer.

The plastic article is preferably composed of a thermoplastic, in particular of the same material as the plastic backing film.

Preference is given to a shaped plastic part made from a thermoplastic, in the case of which the plastic article has been directly welded or adhesive-bonded and/or has been connected by injection moulding, and in particular has been directly connected to the conducting layer by injection moulding.

In a preferred version the plastic article is composed of a thermosetting plastic, in particular of a plastic selected from the group consisting of UF (urea/formaldehyde resins), PF (phenol/formaldehyde resins), EP (epoxy resins), PI (polyimides) and polyacrylate, preferably PMMA.

The plastic article made from a thermoset has preferably been directly adhesive-bonded to the plastic film at free locations between the tracks of the conducting layer.

Preference is given to a shaped plastic part, in the case of which the composite made from plastic film, from metalizable primer layer and from electrically conducting layer has a three-dimensional shape. In a manner similar to the build-up of the three-dimensionally shaped flexible film, the shaped plastic part may also be given a three-dimensional shaping of the conductive tracks by shaping the flat film to correspond to a desired profile, after application of the primer layer and before metalizing, then producing the electrically conducting track by metalization and then connecting the composite made from film, primer layer and electrically conducting layer to the plastic article.

The electrically conducting layer of the shaped plastic part has, in particular, a thickness of from 0.1 to 40 $\mu$m, preferably from 0.5 to 20 $\mu$m, particularly preferably from 1 to 5 $\mu$m.

The electrically conducting layer of the shaped plastic part is preferably composed of a metal suitable for currentless metalization, in particular of Cu, Ni, Ag, Au or Pd, preferably Cu and Ni, particularly preferably Cu, alone or in any desired combination.

For specific applications, for example for screening an object arranged behind the flexible film or behind the shaped plastic part from electromagnetic radiation, preference is given to a film or a shaped plastic part whose electrically conducting layer has a two-dimensional grid structure, where the distance between adjacent grid tracks is preferably from 0.1 mm to 3 cm, particularly preferably from 0.5 mm to 1 cm.

Suitable thermoplastics for the backing film, the outer film or the shaped plastic part of the preferred flexible film or of the preferred shaped plastic part are in principle any of those which can be processed by injection moulding. Examples of these are: acrylonitrile-butadiene-styrene (ABS) polymers, polycarbonate (PC), mixtures of these and flame-retardant grades, and also polyamide (PA), such as polyamide 6 and polyamide 66, polyesters, such as polyethylene terephthalate, polybutylene terephthalate and polyethylene naphthalate, aromatic liquid-crystalline polyesters, polyvinyl chloride (PVC), polyethylene, polypropylene, polyphenylene sulphide, polyphenylene oxide, polyurethanes, polyimides, polyamideimides, polyetherimide, polysulphones, polyacetals and polystyrene, and also copolymers of these or mixtures of the polymers mentioned.

For the purposes of the invention, preferred plastics for injection moulding are acrylonitrile-butadiene-styrene copolymers, polycarbonate, polyamide, polyetherimide and polysulphones, and blends and copolymers of these.

These plastics and their processing by injection moulding, and also the machinery used for this, are known to the person skilled in the art. Depending on the softening range and on the thermal stability of the plastics mentioned, the general range from 150 to 400° C. is possible for injection moulding. Many of these plastics can also be used as the matrix-formers described below: in this case it is advantageous to match plastics for the injection moulding and those used as matrix-formers in such a way that their thermal stability is comparable.

The primer for building up the primer layer essentially consists, in particular, of (i) a polymer used as a film-and/or matrix-former, (ii) a metalization catalyst (activator), (iii) if desired, organic and/or inorganic fillers, (iv) if desired, other constituents, and (v) solvents.

Various compounds can be used as film-and/or matrix-formers, depending on the solvent (organic or aqueous). For primers with an organic solvent system mention may be made, for example, of coating systems, such as alkyd resins, unsaturated polyester resins, polyurethane resins, epoxy resins, modified fats and oils, polymers or copolymers based on vinyl chloride, and also of vinyl ethers, vinyl esters, styrene, (meth)acrylic acid, acrylonitrile, and acrylates, cellulose derivatives and stoving lacquers crosslinking at a relatively high temperature, for example polyurethanes made from hydroxyl-group-containing polyethers, from polyesters or from polyacrylates and from capped polyisocyanates, melamine resins made from etherified melamine-formaldehyde resins and from hydroxyl-group-containing polyethers, from polyesters or from polyacrylates, epoxy resins made from polyepoxides and from polycarboxylic acids, from carboxyl-group-containing polyacrylates and from carboxyl-group-containing polyesters, and stoving lacquers made from polyesters, from polyesterimides, from polyesteramideimides, from polyamideimides, from polyamides, from polyhydantoins or from polyparabanic acids.

Film- and/or matrix-formers based on polyurethane systems built up from the following components have particularly high suitability:

1. Aliphatic, cycloaliphatic, araliphatic, aromatic and heterocyclic polyisocyanates, as described, for example, in Justus Liebigs Annaten der Chemie, 362, pp. 75–136. Particular preference is generally given to the polyisocyanates, which are usually easily available industrially, for example tolylene 2,4- and 2,6-diisocyanate and mixtures of these isomers (TDI); polyphenylpolymethylene polyisocyanates, as prepared by aniline-formaldehyde condensation followed by phosgenation (MDI), and polyisocyanates having carbodiimide groups, urethane groups, allophanate groups, isocyanurate groups, urea groups or biuret groups.

2. Compounds having at least two hydrogen atoms capable of reacting with isocyanates and having a molecular weight of generally from 400 to 10,000, preferably from 1,000 to 6,000, particularly preferably from 2,000 to 6,000. Hydrogen atoms which are capable of reacting are those from amino groups, thiol groups, carboxyl groups and preferably hydroxyl groups.

3. Other compounds as appropriate with hydrogen atoms capable of reacting with isocyanates and which can serve as chain extenders, and also auxiliaries and additives, such as catalysts, surface-active additives and reaction inhibitors. Polyurethanes of this type are known and described, for example, in EP-485 839.

In the case of primers with a predominantly or entirely aqueous solvent system, any dispersible polymer may in principle be used, for example polyacrylates, polybutadienes, polyesters and melamine resins. Here, too, preference is given to the use of polyurethanes or polyurethane ureas, as described in Angewandte Chemie 82, 1970; pp. 53–63, in DE-A 2 314 512 or DE-A 2 314 513. Particularly preferred dispersible polyurethanes essentially have a linear molecular structure and have a) terminal polyalkylene oxide polyether chains with a content of from 0.5 to 10% by weight of ethylene oxide units, based on the entire polyurethane, and b) a content of from 0.1 to 15 milliequivalents per 100 g of quaternized nitrogen, tertiary sulphur, carboxyl groups or sulphonic acid groups. The formulation of preferred dispersible polyurethanes of this type and their preparation are likewise known, and are described, for example, in DE-A 2 651 506.

Activators which may be used are ionogenic and/or colloidal metals and noble metals or covalent organometallic compounds of these or complex compounds with organic ligands. The noble metals are derived from the 1st and 8th subgroups of the Periodic Table (Mendeleev) and are, for example, Pd, Pt, Au or Ag. In general activators also include metal complexes which can be reduced with a reducing agent and thus allow metalization. Particularly preferred activators of this kind are ionogenic and/or colloidal metals which allow metalization in alkaline media with the reducing agent formaldehyde or hypophosphite.

Examples of organic and/or inorganic fillers for primers of this type are the oxides of the elements Mn, Ti, Mg, Al, Bi, Cu, Ni, Sn, Cn and Si, and also silicates, bentonites, talc and chalk. Other individual examples are: pulverized high-melting-point plastics, finely divided silica, carbon blacks, other carbon powders, clay minerals and titanium oxide.

Solvents for the primers which can be used to build up the primer layer are the substances known in printing or coating technology, such as aromatic and aliphatic hydrocarbons, for example toluene, xylene or benzine; glycerol; ketones, for example methyl ethyl ketone or cyclohexanone; esters, for example butyl acetate, dioctyl phthalate or butyl glycolate; glycol ethers, for example ethylene glycol monomethyl ether, diglymes, or propylene glycol monomethyl ether; esters of glycol ethers, for example ethylene glycol acetate or propylene glycol monomethyl ether acetate; diacetone alcohol, N-methylpyrrolidone or N-methylcaprolactam. It is, of course, also possible to use mixtures of these solvents and blends of these with other solvents.

In the case of water-based primers, water may be used alone or in a mixture of water with water-soluble solvents. Examples of solvents miscible with water are alcohols, such as methanol, ethanol, propanol or butanol; ketones, such as acetone, methyl ethyl ketone or cyclohexanone; glycol ethers, such as ethylene glycol monomethyl ether, diglymes or propylene glycol monomethyl ether; and water-soluble ethers, such as tetrahydrofuran or dioxane.

Examples of other constituents for the primers of the primer layer are surfactants, flow control agents, antifoams and dyes in low concentrations of up to 5% by weight, preferably up to 2% by weight, based on the total amount of primer. Constituents of this type are known in principle to the person skilled in the art.

Examples of highly suitable primer formulations of this type are described in EP-A 485 839 and EP-A 503 351.

Other examples of suitable primers are described in EP-A-562 393, EP-A-322 641, EP-A-256 395, EP-A-255 012, U.S. Pat. Nos. 4,663,240, 5,076,841 and DE-A-4 111 817, which are incorporated herein by way of reference.

Preferred primers for the primer layer based on organic solvents essentially consist, for example, of a) a film and/or matrix-former in amounts of from 3 to 30% by weight, b) an ionogenic and/or colloidal noble metal or its covalent organometallic compounds or complex compounds with organic ligands, in amounts of from 0.05 to 2.5% by weight, calculated as metal, c) organic and/or inorganic fillers in amounts of from 0.5 to 35% by weight and d) organic solvents in amounts of from 50 to 90% by weight, all based on the total amount of primer. Primers of this type based on organic solvents particularly preferably have an additional content of e) an organic polymeric and/or prepolymeric additive with a molecular weight of from 500 to 20,000 selected from the class consisting of the polyoxazolines, polymethacrylic acid and its esters, polyacrylates, polyamides, polyesters, polyalcohols and polyamines, in amounts of from 0.1 to 15% by weight, based on the total formulation of the primer.

Preferred primers based on aqueous formulations essentially consist of a) a polymer dispersible in water, preferably a polyurethane, in amounts of from 5 to 60% by weight, preferably from 15 to 45% by weight, b) a metalization catalyst in the form of an anionic or complex noble metal compound, in amounts of from 0.02 to 3.5% by weight, preferably from 0.05 to 0.5% by weight, c) if desired, fillers, in amounts of from 0 to 70% by weight, preferably from 5 to 35% by weight, d) if desired, other constituents of the type mentioned, in amounts of from 0 to 5% by weight, preferably from 0 to 2% by weight and e) water, in amounts of from 20 to 88% by weight, preferably from 25 to 50% by weight, based in each case on the total amount of the primer.

Water-soluble organic solvents of the type mentioned and which can, if desired, be used concomitantly may replace not more than ⅓, preferably not more than ¼, particularly preferably not more than ¹⁄₁₀, of the amount of water mentioned.

The thickness of the primer layer may be varied within a wide range, in particular from 0.1 to 200 $\mu$m, preferably in the range from 5 to 50 $\mu$m. For solvent-containing primers there is a particularly preferred range of 5–30 $\mu$m; for aqueous primers there is a particularly preferred range of 10–50 $\mu$m. After drying of the primer at up to 250° C. and preferably, depending on the plastic used, from 50 to 200° C., the dry thickness of the primer layer is typically about half of the thickness of the primer applied wet. The duration of the drying, depending on the temperature used, is from a few minutes to several hours, preferably from 5 to 90 minutes.

Other primers suitable in principle are described in U.S. Pat. Nos. 4,514,586, 4,663,240, 5,076,841, 5,075,039 and 5,120,578, which are incorporated herein by way of reference.

The invention also provides a process for producing the novel flexible film by a) applying a primer, preferably in solution, to a plastic film, in particular by printing, in particular by screen printing, spraying, coating, dipping or depositing sputtered primer with formation of a primer layer which may be structured if desired, b) drying the primer layer, c) if desired, further forming of the desired structure by curing or solidifying the primer at the desired points using heat or radiation, in particular by UV, IR or X-ray radiation or by visible light, preferably using laser radiation, and, if desired, then dissolving out the primer material which has not solidified or forming the desired structure by removing undesired areas of the primer layer, for example by laser-ablation, or also using plasma treatment, reactive ion etching or bombardment by beams of electrons or of ions, if desired using an exposure mask
with development of the structure d) if desired, three-dimensional shaping of the plastic film with structured primer layer by, in particular, blow moulding, thermoforming, deep drawing, deep drawing with suction or pressure forming, or by a combination of these shaping processes, e) metalizing the structured primer layer, in particular by chemical metalization, to build up an electrically conducting layer, f) if desired, galvanic thickening of the electrically conducting layer, g) connecting the composite made from plastic film, primer layer and electrically conducting layer to a plastic outer film by welding or adhesive bonding.

The invention also provides a process for producing a novel shaped plastic part with conductor tracks by the following steps a) applying a primer, preferably in solution, to a plastic film, in particular by printing, in particular by screen printing, spraying, coating, dipping or depositing sputtered primer with formation of a primer layer which may be structured if desired, b) drying the primer layer, c) if desired, further forming of the desired structure by curing or solidifying the primer at the desired points using heat, radiation, in particular by UV, IR or X-ray radiation or by visible light, preferably using laser radiation, and, if desired, then dissolving out the primer material which has not solidified or forming the desired structure by removing undesired areas of the primer layer, for example by laser-ablation, or also using plasma treatment, reactive ion etching or bombardment by beams of electrons or of ions, if desired using an exposure mask
with development of the structure d) if desired, three-dimensional shaping of the plastic film with structured primer layer by, in particular, blow moulding, thermoforming, deep drawing, deep drawing with suction or pressure forming, or by a combination of these shaping processes, e) metalizing the structured primer layer, in particular by chemical metalization, to build up an electrically conducting layer, f) if desired, galvanic thickening of the electrically conducting layer, g) adhesive bonding of a preformed thermosetting or thermoplastic plastic article whose profile preferably corresponds to the profile of the composite made from plastic film, primer layer and from electrically conducting layer, on the side of the electrically conducting layer, to the composite in such a way that the plastic article covers at least part, in particular at least 95%, of the electrically conducting layer.

When a thermoplastic material is used for the plastic article, the shaped plastic part with conductor tracks may also be produced by, instead of step g), h) in an injection mould, back-moulding of the composite made from plastic film, primer layer and electrically conducting layer, on the side of the electrically conducting layer, with a thermoplastic, with formation of a plastic article, in such a way that the plastic article covers at least part, in particular at least 95%, of the electrically conducting layer.

The primer is preferably applied by screen printing. Screen printing can thus be used to print the conductor track structure directly. The metalizable primer is then metalized in an additive process using chemical metalizing baths. If desired, the metalizing may be preceded by an activation step. This process is familiar to the person skilled in the art as an additive process.

In an alternative process, the entire area of the primer is applied by screen printing. In this case the primer is applied flat and then structured, for example by exposure to heat. Areas which have not been treated are then removed by means of a further step. This further step may, for example, be washing out by a solvent or water. The resultant conductor tracks are then metalized chemically by an additive process. In some cases an activation process must take place prior to the chemical metalization.

Another method of application is application over an area, by spraying, dipping or atomizing (sputtering) the primer or by other physical or chemical surface-treatment processes. The primer may be structured by exposure to heat or by radiation, in which case preferably UV radiation or radiation in the visible region, or else IR radiation. After structuring, the untreated primer is preferably removed by washing out. The primer layer, now structured, is then metalized in an additive chemical process. If desired, a process for activating the primer is interposed additionally prior to the metalization.

These steps may be carried out in the same way in a negative-image process.

The primer may also be structured by laser-structuring, also known to the person skilled in the art as laser ablation.

Another preferred application process forming a structure is spraying of the backing film with primer through a structured mask.

The metalizing baths used for the currentless metalization are available commercially and known to the person skilled in the art. Examples of suitable metals for producing the electrically conducting layer, in particular the conductor tracks, are Cu, Ni, Ag, Au and Pd, preferably Cu.

If there is subsequent galvanic thickening of the chemically metalized electrically conducting layer, in particular of the conductor tracks, the thickness of the metal layer may be built up as far as 500 $\mu$m.

The adhesive bonding of the backing film coated with conductor tracks to an outer film or to an appropriately preformed plastic article takes place by processes which are known in principle.

The ease of adhesive bonding of plastics is known to be dependent on polarity, wetting behaviour and the development of adhesive forces. Preference is given to solvent adhesives and reactive adhesives for adhesive bonding of the plastics. Suitable adhesives are based, inter alia, on acrylates, cyanoacylates, polyurethanes, celluloses, polyethers, polyetherimides, polyetherester, polysulphones, polysulphides, polybenzimidazoles, polyimides, polyarmides, polyesteramides, polyester, silicones, polychloroprenes, rubbers, epoxides or block polymers or copolymers, or similar systems known in principle to the person skilled in the art. Both single-component and multicomponent adhesive systems based on various components are included here. Other examples given of adhesive systems are solvent adhesives, in which case an important part is played by the extent to which the plastics to be adhesively-bonded are soluble in the solvent of the adhesive. In specific cases it is also possible to use a pure solvent for adhesive bonding if the solvents are capable of initiating solution of, or causing swelling of, the surface of the plastics. It is, however, also possible to use hot-melt adhesives for adhesive bonding of the plastic films.

Other examples of suitable bonding processes have been disclosed in: Habenicht, Kleben [Adhesive Bonding], pp. 335–351, Berlin: Springer 1986 or: VDI-Gesellschaft für Kunststoffkleben, Klebstoffe und Klebverfahren für Kunststoffe, [Gernian Engineers Association—Society for Adhesive Bonding of Plastics, Adhesives and Adhesive Bonding Methods for Plastics] Düsseldorf: VDI 1979.

Alternatively, the backing film coated with conductor tracks may be connected to an outer film by lamination using processes which are known in principle.

Lamination of two plastic films is understood to mean using exposure to heat to connect the two plastic films so as to give firm adhesion. The lamination of films is also occasionally termed welding. The advantage of welding over adhesive bonding is that there is no need for an adhesive to provide the bond. Welding of two or more plastic films produces firm and virtually permanent connection of the plastic films.

The plastic backing film and/or the outer film used are particularly preferably deep-drawable plastic films.

Deep-drawable films can be understood to be any plastic film which can be shaped by a physical process. Thermoplastic films are particularly suitable here. A preferred shaping process is thermoforming. In this, the plastic film can be pressed onto a mould. Another suitable and frequently used process to achieve three-dimensional shaping is the blow-moulding process using pressure, known to the person skilled in the art as pressure forming, or more specifically pressure thermoforming. The temperature ranges for these processes are known and are generally from room temperature to well above 100° C., depending on the film material used. Temperatures above 250° C. are also not uncommon for plastic films with particularly good thermal stability. Another process known to the person skilled in the art is deep drawing, specifically thermal deep drawing with the use of suction. The reaction in pressure has to be matched to the specific plastic film and also to its thickness. The particular conditions for thermal deep drawing are known to the person skilled in the art.

Suitable plastic films are in principle all thermoplastic films, and also plastic composites which can be shaped. Examples of these are film grades made from the following polymers: acrylonitrile-butadiene-styrene (ABS) polymers, polycarbonate, mixtures of these and flame-retardant grades, and also polyamides, polyester grades, such as polyethylene terephthalate (PET), polybutylene terephthalate, polyethylene naphthalate (PEM), aromatic liquid-crystalline polyesters, polyvinyl chloride (PVC), polyethylene, polypropylene, polyethylene oxide, polyimides, polyamideimides, polyetherimides, polyurethanes, polysulphones, polyacetals and polystyrene, and also copolymers of these or mixtures made from these polymers.

In particular, the film for the backing layer and the outer layer films have a thickness of from 0.1 to 2 mm, particularly preferably from 0.25 to 1 mm.

The advantage of the preferred flexible film with a metallic grid of conductor tracks when compared to a known full-surface-metalized film is that, with the grid design of the conductor tracks, the free surfaces of the plastic give excellent weldability of the metalized side of the backing film. The direct contact between the free surfaces of the plastic and the outer film therefore allows the simple lamination of films to produce screening. In a full-surface-metalized plastic film the metalized side of the film is not weldable. A full-surface-metalized side of a plastic film can therefore not be welded to an outer film, or the resultant bond is mechanically poor. The free locations in the metalized grid therefore permit the metalized side of the backing film to be bonded to the plastic outer film. The adhesion of the bond is so firm that the welded plastic films cannot be separated again mechanically without spoiling the material. In a tensile test, the bond between the free locations of plastic on the metalized side of the backing film and the outer film exhibits the properties of a homogeneous film.

The free locations of the surface created by the metallic grid design also permit ready adhesive bonding between the metalized side of the plastic film and the plastic outer film. The bond produced by adhesive-bonding of the metalized side of the metalized conductor track to a plastic outer film has firm adhesion, far firmer than the bond strength of an adhesive bond between a full-surface-metalized plastic film and an outer film.

The invention also provides the use of the novel flexible films or of the shaped plastic parts as platinae or electromagnetic screening, e.g. in electrical devices, in particular for screening against electromagnetic radiation of wavelength from 1 Mhz to 500 Ghz.

Other advantages of using the novel flexible film or the novel shaped plastic part relate to electrical interconnects.

Formation of, for example, a metal grid allows electrical interconnects through the film at the gaps in the metal grid which are free from metal. Short circuits, which occur in full-surface-metalized films, can be avoided. Interconnects of this type are known to the person skilled in the art by, inter alia, the term "vias or micro vias" or also "through holes". The specific grid design of the conductor tracks also permits through-contacts without escapes of electrical charge occurring, as they do in full-surface-metalized films. Another process for forming contacts without any risk of escape of electrical charge is soldering. It is clear that the preferred grid pattern ensures that an interconnect, preferably an electrical interconnect or connection, can be made using the grid in the flexible film without any risk of escape of electrical charge.

A particular advantage of the invention consists in protection from materials producing metallic contact allergies (cf. Römpp-Lexikon Umwelt [Römpp Environmental Encyclopaedial], CD-Rom Version 1.0):

Typically, copper is used for electromagnetic screening of electrical devices and for forming conductor tracks in electronic circuits. To protect the copper from oxidation, a thin covering of nickel is applied to the surface of the copper. Nickel is well known to produce contact allergies. In a production process in which nickel or any other material which produces a contact allergy is used in the form which could give points of contact with the skin, the level of workplace protection required is generally increased. The welding or adhesive bonding of metalized conductor tracks to an outer film means that there is no longer a need for a nickel layer to protect the copper against corrosion. This increases operator safety. Conductor tracks which are composed of a material which produces contact allergies are all likewise screened by the firm adhesive bond between the conductor track face and an outer film. This therefore excludes the possibility of contact even during any possible subsequent production or processing steps.

It is also in particular possible to apply additional conductor tracks to the reverse side of a film provided with conductor tracks using the same method as that employed for the film according to the invention. The additional conductor tracks can be applied by printing both sides of the backing film with a primer, followed by metalization and covering with outer films. An assembly is formed which contains for example a screening network of copper on the one side and conductor tracks of a printed circuit on the other side. The assemblies produced by this method can also have any desired shape. In order to protect the conductor tracks outer films can be injection-moulded on to both sides and/or a thermoplastic synthetic resin can be injection-moulded on to one or both sides. The primer can connect the front primer layer with the reverse primer layer at specially provided through-holes in the backing film. This allows direct connections between selected conductor tracks on the front and reverse sides of the backing film.

The invention is described in more detail below by way of example, using the figures, but without thereby limiting the scope of its constituent parts.

Figure 2:
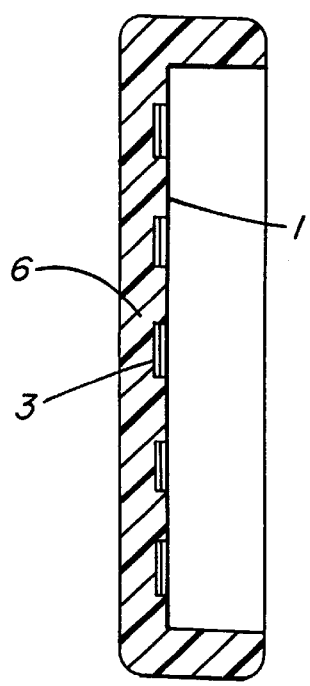
Figure 3:
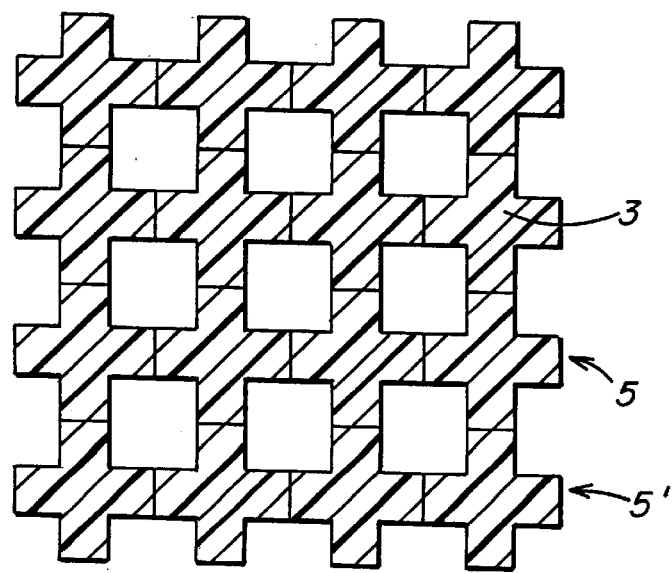
Figure 4:
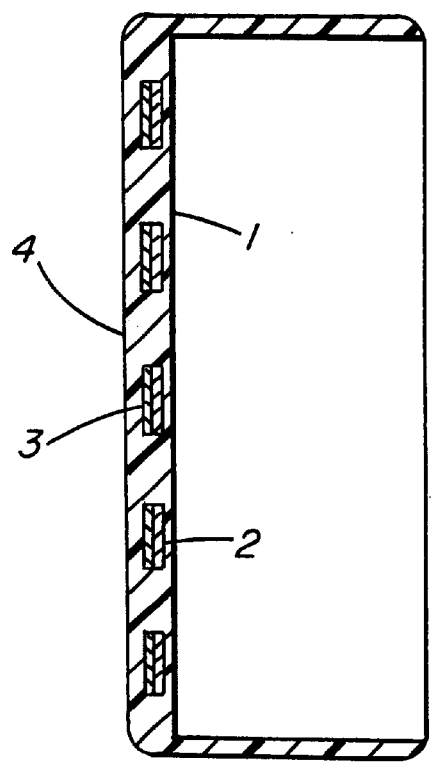

The Figures Show:

FIG. 1 a simplified diagram of one embodiment of the flexible film in cross section FIG. 2 a simplified diagram of one embodiment of the novel shaped plastic part with conductor tracks FIG. 3 a simplified diagram of the grid structure of the electrically conducting layer for a film for electromagnetic screening FIG. 4 a simplified diagram of one embodiment of the flexible film with electrical conductor track in a three-dimensional shape.

Figure 5:
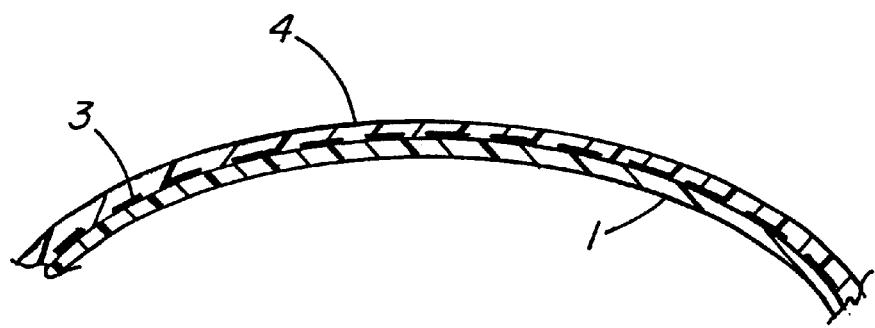

FIG. 5 the cross-section of a plastic shaped part with a conductor track in which the conductor track has a three-dimensional shape.

Figure 6:
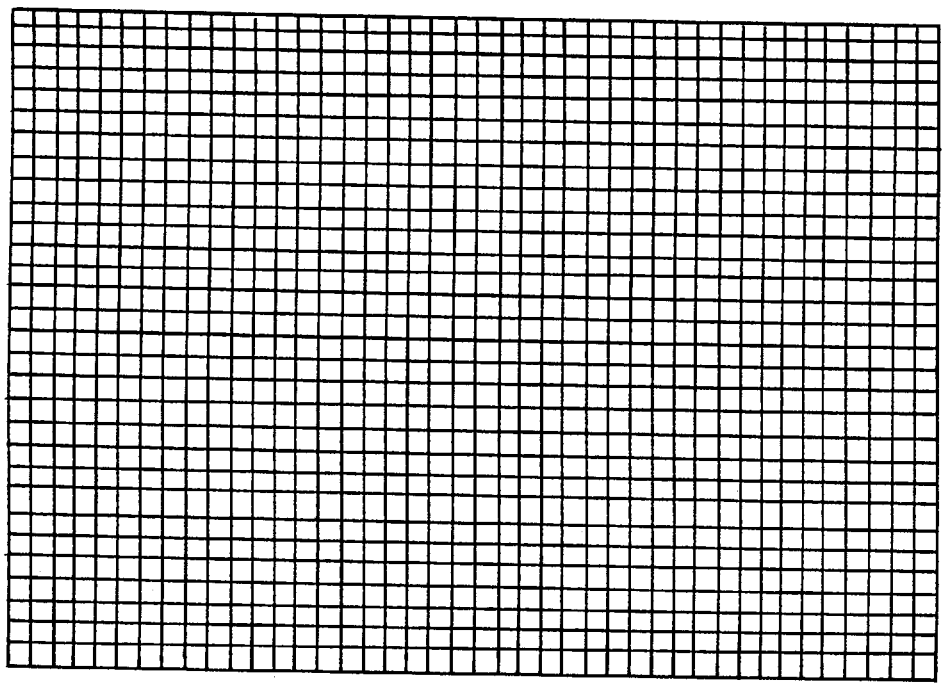

FIG. 6 a diagram of the design of copper tracks as a screening grid in the flexible film.

Figure 7:
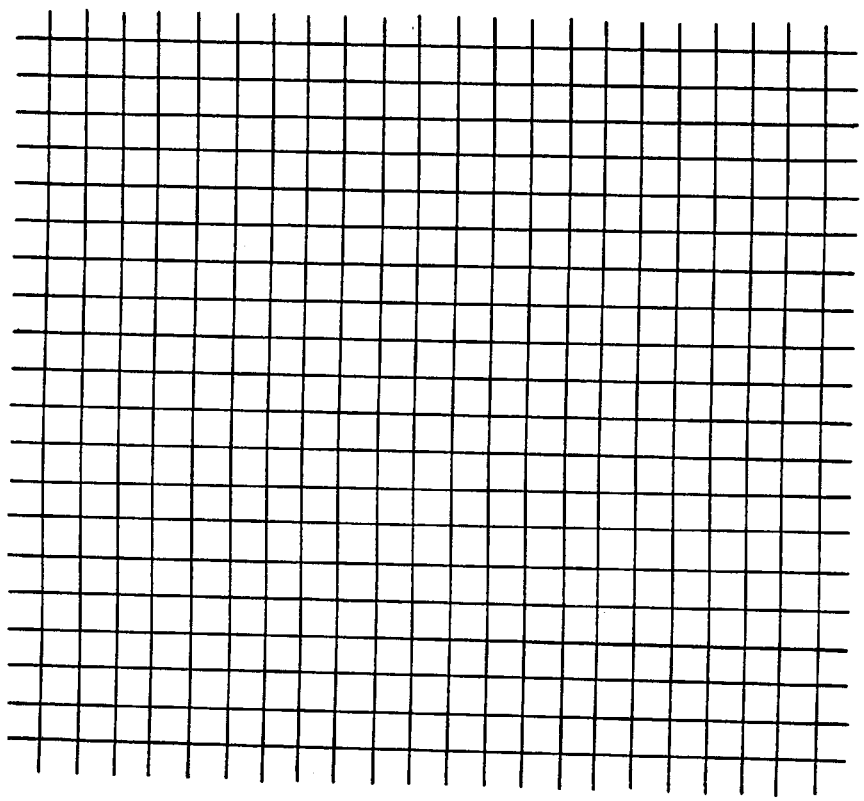

FIG. 7 the design of a wider copper screening grid in the flexible film.

EXAMPLES

Example 1

A flexible film has a structure as in FIG. 1, made from a polycarbonate backing film 1 onto which is printed a grid network 2 made from a metalizable primer (of a layer thickness of approx.2 $\mu$m). The primer had the following composition (1000 g):

| | |
|---|---|
| 149 g | Desmolac 2100 (Polyurethane binder; NW 4000 |
| 484 g | N-Methyl-caprolactam (NMC) |
| 283 g | Methoxypropylacetate (MPA) |
| 8.6 g | Activator GSK 4138 (Pd Cl$_2$) |
| 1.2 g | Calciumcarbonat |
| 54.7 g | Aerosil (SiO$_2$, finedispers) |
| 19.5 g | Heliogenblau (Dye; 18.5% in MPA) |

With the aid of a metalization bath a copper layer 3 (of a layer thickness of 2 $\mu$m) was deposited on this grid network. For this purpose a McDermid XD-6157-T copper metalization bath was used, which contained an aqueous CuIISO$_4$ solution (of a pH of approx. 11, T: 70° C., 2 g/L Cu in the form of CuSO$_4$, 9 g/l of NaOH, 2 g/l of formaldehyde). Finally, the copper layer was covered by another polycarbonate outer film 4, which is welded to the polycarbonate film 1 in the free areas in the copper grid 3. The copper grid had the design shown in FIG. 3. The crossed copper tracks 5 and 5' had a width of 2 mm and were about 3 mm distant from one another (cf. FIG. 6). By way of the assembly the copper tracks are completely covered and protected against oxidation. At specific locations the outer film 4 has openings which expose the copper tracks. At these locations the copper grid can be electrically contacted. The gradual oxidation of the copper in air can also be observed at these locations.

Example 2

In another experiment, after a grid pattern made from primer 2 (composition as in example 1) had been printed on, the film was shaped in a deep-drawing apparatus. A copper layer 3 (of a layer thickness of 2 $\mu$m) was again, similarly to Example 1, deposited onto this grid network, using a metalizing bath. Instead of laminating a polycarbonate outer film 4, the polycarbonate outer film 4 was adhesively bonded to the polycarbonate backing film 1. FIG. 4 shows a lateral cross section of the resultant flexible film with copper track 3.

Example 3

The method of Example 2 was used to produce a shaped plastic part with conductor tracks corresponding to the cross section of FIG. 3. However, after application of the copper layer 3 the shaped film was placed into an injection mould and back-moulded with polycarbonate to form a plastic article 6; the plastics of the backing film and of the moulded-on polymer were able to be directly connected to each other in the free areas between the conductor tracks 3.

Example 4

As shown in FIG. 1 a flexible film is produced from a polycarbonate backing film 1, on to which a grid network 2 of a metalized primer (composition as in example 1) is printed. The dry layer thickness of the primer was approx. 2 $\mu$m. With the aid of a metalization bath according to Example 1 a firmly adhering copper layer 3 (of a layer thickness of 2 $\mu$m) was deposited on the grid network. The adhering strength of the copper layer was 30 N/25 mm, as measured according to DIN 53494. Finally the copper layer was covered with an additional polycarbonate film 4 which is welded with the polycarbonate backing film 1 in the free areas of the copper grid 3. The laminating temperature was 185° C. at a compression force of 10 bar and a pressing time of 10 secs. The copper grid had the design shown in FIG. 6. The copper tracks 5 and 5' had a width of 2 mm and the distance between them was 3 mm. The polycarbonate outer film 4 and the polycarbonate backing film 1 are inseparably connected to each other after welding. The copper conductor tracks remain intact after repeatedly bending the film. On attempting to separate the welded films both films tear. The strength of the bond between the two polycarbonate films is thus greater than the resistance to tearing of the bond between the polycarbonate outer film 4 and the polycarbonate backing film 1.

Example 5 (Comparison)

A flexible full-surface pure copper film of a thickness of 30 $\mu$m (measuring 10×5 cm) is pressed for 10 secs. on to a polycarbonate film at 185° C. and a compression pressure of 10 bars. The strength of the bond between the copper film and the polycarbonate film is 2.5 N/25 mm according to DIN 53494. The copper film separates readily from the polycarbonate film in the peripheral regions on bending the flexible film.

Example 6

As shown in FIG. 1 a flexible film was produced from a polycarbonate backing film 1 on to which a grid network 2 of a metalizable primer was printed. The dry layer thickness of the primer was approx. 2 µm. With the aid of a metalization bath (as in Example 1) a firmly adhering copper layer 3 (of a layer thickness of 2 µm) was deposited on this grid network. The adhering strength of the copper layer 3 was 30 N/25 min according to DIN 53494. Finally the copper layer 3 was covered with a polycarbonate outer film 4 which was bonded to the polycarbonate film 1 in the free areas of the copper grid 3. The adhesive was a solvent-containing polyurethane adhesive (Mecotherm® L 147). Kiwodur® L 551 (a hardener based on an aromatic polyisocyanate) was added as a hardener. The copper grid 3 had the design shown in FIG. 6. The copper tracks 5 and 5' had a width of 2 mm and the distance between them was 3 mm. The polycarbonate outer film 4 and the polycarbonate backing film 1 were adhesively bonded to each other at 175° C. for 3 secs. at a compression pressure of 10 bars. The strength of the bond between the two polycarbonate films was 30 N/25 mm according to DIN 53494. The film obtained formed a flexible assembly which was extremely difficult to separate.

Example 7 (Comparison)

A flexible full-surface copper film (of a thickness of 30 µm and measuring 5×10 cm) was adhesively bonded to a polycarbonate film at 175° C. and a compression pressure of 10 bars for 3 secs. The adhesive used was a polyurethane adhesive as in Example 6 (Mecotherm® L 147). Kiwodur® L 551 (a hardener based on an aromatic polyisocyanate) was added as the hardener. The strength of the bond between the copper film and the polycarbonate film was 5 N/25 mm according to DIN 53494.

Example 8

Similarly to FIG. 1 a flexible film was produced from a polyester backing film (PET) 1, on to which a grid network 1 of a metalizable primer (composition as in example 1) was printed. The dry layer thickness of the primer was approx. 2 µm. A firmly adhering copper layer 3 (of a layer thickness of 2 µm) was deposited onto this grid network with the aid of a metalization bath, as described in Example 1. The adhering strength of the copper layer 3 was 30 N/25 mm according to DIN 53494. Finally the copper layer was covered with an additional polyester outer film 4 which was bonded to the polyethylene terephthalate (PET) backing film 1 (Autotype CT5) in the free areas of the copper grid 4. The adhesive used was a polyurethane adhesive of the kind used in Example 6 (Mecotherm® L 147). Kiwodur® L 551 was added as a hardener. The copper grid had the design depicted in FIG. 6. The copper tracks 5 and 5' had a width of 2 mm and the distance between them was 3 mm. The polyester outer film 4 and the polyester backing film 1 were adhesively bonded to each other at 175° C. for 3 secs at a compression pressure of 10 bars. The strength of the bond between the two films was 15 N/25 mm according to DIN 53494.

Example 9 (Comparison)

A flexible, full-surface copper film (of a thickness of 30 µm and measuring 5×10 cm) was adhesively bonded to a polyester (PET) film Autotype CF5 at 175° C. using a compression pressure of 10 bars for 3 secs. The adhesive was a polyurethane adhesive as described in Example 6 (Mecotherm® L 147). Kiwodur® L 551 was added as the hardener. The bond between the copper film and the polyester film is lower than 2.5 N/25 mm. The copper film can be relatively easily pulled away again from the PET film.

Example 10

A flexible film was produced as in FIG. 1 from a polycarbonate backing film 1, on to which a grid network 2 of a metalizable primer (of a layer thickness of approx. 2 µm) (composition as in example 1) was printed. The dry layer thickness of the primer was approx. 2 µm. A firmly adhering copper layer 3 of a thickness of 2 µm was deposited on to this grid network with the aid of a metalization bath as in Example 1. The copper tracks 5 and 5' had a width of 2 mm and the distance between them was 3 mm (cf. FIG. 6). The near field attenuation value of the finished flexible film (measured according to the US standard MIL-STD 285) at a frequency of 27 MHz was 28 dB.

Example 11

A flexible film was produced similarly to FIG. 1 from a polycarbonate backing film 1, on to which a grid network 2 of a metalizable primer (composition as in example 1) was printed. The dry layer thickness of the primer was approx. 2 µm. A firmly adhering copper layer 3 of a thickness of 2 µm was deposited on to this grid network with the aid of a metalization bath as described in Example 1. The copper tracks 5 and 5' had a width of 2 mm and the distance between them was 5 mm (cf. FIG. 7). The near field attenuation value of the film according to US MIL-STD 285 at a frequency of 27 MHz was 18 dB.

Example 12

A shaped part with conductor tracks was produced from a polycarbonate backing film, on to which a grid network 2 of a metalizable primer (composition as in example 1) was printed. The dry layer thickness of the primer was approx. 2 µm. The printed polycarbonate backing film was moulded into a spherical shape (not depicted) with the aid of the high-pressure deep-drawing process. A firmly adhering copper layer 3 of a thickness of 2 µm was deposited on to this three-dimensionally shaped grid network with the aid of a metalization bath (as described in Example 1). The copper tracks 5 and 5' had a width of 2 mm and the distance between them was 3 mm. The copper tracks were covered with a moulded-on plastic 4 (polycarbonate) (cf. FIG. 5). The near field screening value (measured according to US standard MIL-STD 285) at 27 MHz was 28 dB. The screening capacity of the shaped part was not adversely affected by the shaping of the film prior to metalization.

Although the present invention is described in detail with reference to certain preferred versions thereof, other variations are possible. Therefore, the spirit and scope of the appended claims should not be limited to the description of the versions contained therein.

What is claimed is:

1. A flexible film with a protected conductor track comprising:
    (a) a plastic film, as a backing layer, that has a metalizable primer layer applied thereto,
    (b) a structured, metallic, electrically conducting layer that includes at least one electrical conductor track, and that is applied to the primer layer, and
    (c) an outer film that (i) is firmly connected to the backing layer, the primer layer, and the metallic, electrically conducting layer, and (ii) covers at least part of the metallic, electrically conducting layer.

2. The flexible film of claim 1, wherein the outer film covers at least about 95% of the metallic, electrically conducting layer.

3. The flexible film of claim 1, wherein the outer film comprises a thermoplastic selected from the group consisting of acrylonitrile-butadiene-styrene polymers, polycarbonates, polyamides, aromatic liquid-crystalline polyesters, polyvinyl chloride, polyethylene, polypropylene, polyphenylene sulphide, polyphenylene oxide, polyurethanes, polyimides, polyamideimides, polyetherimide, polysulphones, polyacetals, polystyrene, copolymers thereof, and mixtures thereof.

4. The flexible film of claim 1, wherein the outer film is directly welded or bonded with an adhesive to the plastic film at free locations that are located between tracks of the metallic, electrically conducting layer.

5. The flexible film of claim 1, wherein the outer film is a thermosetting polymer that is selected from the group consisting of urea/formaldehyde resins, phenol/formaldehyde resins, epoxy resins, polyimides, and polyacrylates.

6. The flexible film of claim 5, wherein the outer film is bonded directly to the plastic film with an adhesive at free locations between tracks of the metallic, electrically conducting layer.

7. The flexible film of claim 1, wherein the film has a three-dimensional shape.

8. The flexible film of claim 1, wherein the electrically conducting layer has a thickness ranging from about 0.1 to about 40 $\mu$m.

9. The flexible film of claim 1, wherein the electrically conducting layer comprises a metal that is selected from the group consisting of Cu, Ni, Ag, Au Pd, and combinations thereof.

10. The flexible film of claim 1, wherein the electrically conducting layer has a two-dimensional grid structure and the distance between adjacent grid tracks ranges from about 0 mm to about 3 cm.

11. A plastic part having an embedded protected conductor track comprising:
(a) a plastic film, as a backing layer, that has a metalizable primer layer applied thereto,
(b) a structured, metallic, electrically conducting layer that includes at least one electrical conductor track, and that is applied to the primer layer, wherein the backing layer, primer layer, and conducting layer form a composite; and
(c) a plastic article that is firmly connected to the composite in such a way that the plastic article covers at least part of the metallic, electrically conducting layer.

12. The plastic part of claim 11, wherein the plastic article covers at least about 95% of the metallic, electrically conducting layer.

13. The plastic part of claim 11, wherein the outer film comprises a thermoplastic selected from the group consisting of acrylonitrile-butadiene-styrene polymers, polycarbonates, polyamides, aromatic liquid-crystalline polyesters, polyvinyl chloride, polyethylene, polypropylene, polyphenylene sulphide, polyphenylene oxide, polyurethanes, polyimides, polyamideimides, polyetherimide, polysulphones, polyacetals, polystyrene, copolymers thereof, and mixtures thereof.

14. The plastic part of claim 11, wherein the plastic article is directly connected to the plastic film at free locations between tracks of the metallic, electrically conducting layer by bonding with an adhesive by injection molding to the metallic, electrically conducting layer.

15. The plastic part of claim 14, wherein the plastic article comprises a polymer selected from the group consisting of urea/formaldehyde resins, phenol/formaldehyde resins, epoxy resins, polyimides and polyacrylates.

16. The plastic part of claim 15, wherein the plastic article is directly bonded to the plastic film with an adhesive at free locations between tracks of the metallic, electrically conducting layer.

17. The plastic part of claim 11, wherein the composite has a three-dimensional shape.

18. The plastic part of claim 11, wherein the electrically conducting layer has a thickness that ranges from about 0.1 to about 40 $\mu$m.

19. The plastic part of claim 11, wherein the electrically conducting layer comprises a metal component selected from the group consisting of Cu, Ni, Ag, Au, Pd, and combinations thereof.

20. The plastic part of claim 11, wherein the electrically conducting layer has a two-dimensional grid structure and the distance between adjacent grid tracks ranges from about 0.1 mm to about 3 cm.

21. A process for making a flexible film that includes:
(i) a plastic film, as a backing layer, that has a metalizable primer layer applied thereto,
(ii) a structured, metallic, electrically conducting layer that includes at least one electrical conductor tracks and that is applied to the primer layer, and
(iii) an outer film that (a) is firmly connected to the backing layer, the primer layer, and the metallic, electrically conducting layer, and (b) covers at least part of the metallic, electrically conducting layer, wherein the process comprises:
(a) applying a primer to a plastic film and forming a structured primer layer;
(b) drying the primer layer;
(c) metalizing the structured primer layer and building up an electrically conducting layer, wherein the plastic film, primer layer, and electrically conducting layer form a composite;
(d) connecting the composite to a plastic outer film by welding or adhesive bonding.

22. The process of claim 21, wherein the flexible film is formed (1) by curing or solidifying the primer at predetermined points using heat or radiation and dissolving out primer material which has not solidified or (2) by removing predetermined areas of the primer layer.

23. The process of claim 21, wherein the plastic film is subjected to three dimensional shaping With a structured primer layer.

24. The process of claim 21, wherein the electrically conducting layer is subjected to galvanic thickening.

25. A process for producing a plastic part having an embedded protected conductor track that includes:
(i) a plastic film, as a backing layer, that has a metalizable primer layer applied thereto,
(ii) a structured, metallic, electrically conducting layer that includes at least one electrical conductor track, and that is applied to the primer layer, wherein the plastic film, primer layer, and electrically conducting layer form a composite, and (iii) a plastic article that is firmly connected to the composite in such a way that the plastic article covers at least part of the metallic, electrically conducting layer, wherein the process comprises:

(a) applying a primer to a plastic film, by printing, screen printing, spraying, coating, dipping or by depositing a sputtered primer with and forming a structured primer layer;

(b) drying the primer layer;

(c) metalizing the structured primer layer and building up an electrically conducting layer;

(d) adhesively bonding a preformed thermosetting or thermoplastic plastic article on the side of the electrically conducting layer of the composite in such away that the plastic article covers at least part of the electrically conducting layer.

26. The process of claim 25, wherein the plastic article covers at least about 95% of the electrically conducting layer.

27. The process of claim 25, wherein the plastic part is formed (1) by curing or solidifying the primer at predetermined points using heat or radiation and dissolving out primer material which has not solidified or (2) by removing predetermined areas of the primer layer.

28. The process of claim 25, wherein the plastic film is subjected to three dimensional shaping with a structured primer layer.

29. The process of claim 25, wherein the electrically conducting layer is subjected to galvanic thickening.

* * * * *